(12) United States Patent
MacNeil et al.

(10) Patent No.: US 7,205,246 B2
(45) Date of Patent: Apr. 17, 2007

(54) FORMING LOW K DIELECTRIC LAYERS

(75) Inventors: John MacNeil, Cardiff (GB); Sajid Ishaq, Bristol (GB); Hervé Gris, Gegre (FR); Katherine Giles, Bristol (GB)

(73) Assignee: Aviza Technology Limited, Newport, Gwent (GB)

( * ) Notice: Subject to any disclaimer, the term of this patent is extended or adjusted under 35 U.S.C. 154(b) by 481 days.

(21) Appl. No.: 10/298,225

(22) Filed: Nov. 18, 2002

(65) Prior Publication Data

US 2003/0124870 A1 Jul. 3, 2003

Related U.S. Application Data

(60) Provisional application No. 60/391,970, filed on Jun. 28, 2002.

(30) Foreign Application Priority Data

Nov. 16, 2001 (GB) ................................. 0127474.5

(51) Int. Cl.
*H01L 21/00* (2006.01)

(52) U.S. Cl. ..................................... 438/758

(58) Field of Classification Search ................ 438/653, 438/629, 619, 396, 253, 240, 3, 758; 73/24.04; 257/760
See application file for complete search history.

(56) References Cited

U.S. PATENT DOCUMENTS

| 5,472,913 | A | | 12/1995 | Havemann et al. | |
|---|---|---|---|---|---|
| 5,571,944 | A | * | 11/1996 | Pfeifer et al. | 73/24.04 |
| 6,313,046 | B1 | | 11/2001 | Juengling et al. | |
| 6,413,852 | B1 | * | 7/2002 | Grill et al. | 438/619 |
| 6,492,222 | B1 | * | 12/2002 | Xing | 438/240 |
| 6,737,747 | B2 | * | 5/2004 | Barth et al. | 257/760 |
| 6,815,329 | B2 | * | 11/2004 | Babich et al. | 438/619 |

FOREIGN PATENT DOCUMENTS

| EP | 0 687 004 A1 | 6/1995 |
|---|---|---|
| EP | 0 689 235 A1 | 6/1995 |
| EP | 0 684 642 A1 | 11/1995 |
| EP | 0 881 678 A2 | 12/1998 |
| EP | 1 094 506 A2 | 4/2001 |

* cited by examiner

*Primary Examiner*—Carl Whitehead, Jr.
*Assistant Examiner*—Monica D. Harrison
(74) *Attorney, Agent, or Firm*—Volentine & White, PLLC

(57) ABSTRACT

A low k dielectric layer is formed by depositing an unset dielectric layer on a substrate, the dielectric layer including Silicon, Carbon and Oxygen. The surface of the dielectric layer exposed to an activated gas to form a semi-permeable skin on or of the surface of the layer. The layer is then cured to render at least part of the layer porous.

43 Claims, 2 Drawing Sheets

(a)

(b)

FORMING LOW K DIELECTRIC LAYERS

CROSS-REFERENCE TO RELATED APPLICATIONS

A claim of priority is made to U.S. Provisional Patent Application Ser. No. 60/391,970, filed Jun. 28, 2002, and to British Patent Application No. 0127474.5, filed Nov. 16, 2001, the contents of both of which are incorporated herein by reference.

BACKGROUND OF THE INVENTION

1. Field of the Invention

This invention relates to a method of forming low k dielectric layers, the layers so formed and devices incorporating such layers.

2. Description of the Related Art

In our British Patent Applications Nos. 0117460.6 and 0124356.7, we describe low k dielectric layers having a particular porous structure. At the time that the structure was invented, the mechanism for forming it was not well understood nor was any suggestion made about how to increase porosity and thus reduce dielectric constant further.

SUMMARY OF THE INVENTION

From one aspect the invention consists in a method of forming a low k dielectric layer including:
  (a) depositing an unset dielectric layer on a substrate, the dielectric layer including Silicon, Carbon and Oxygen;
  (b) exposing the surface of the dielectric layer to a plasma such as nitrogen, hydrogen or oxygen to form a semi-permeable skin on or of the surface of the layer; and
  (c) curing the layer to render at least part of the layer porous.

From another aspect the invention consists in a method of forming a low k dielectric layer including:
  (a) depositing an unset dielectric layer on a substrate, the dielectric layer including Silicon, Carbon and Oxygen;
  (b) at least partially curing a surface zone of the layer; and
  (c) curing the layer to render the bulk of the layer porous.

In practice each of the mechanisms described above may be present in many embodiments, but in either case it is believed that the porosity is caused by the outgassing of volatile components within the bulk of the material and either mechanism will tend to slow down the escape of such gases enabling a porous structure to be formed within the material as it sets.

In either of the above mentioned cases the dielectric layer may be deposited by chemical vapour deposition and at least a part of the semi-permeable skin or surface zone may be removed after curing. The dielectric constant (k) of all but an upper carbon depleted layer resulting from plasma exposure may be less than 2.4 and preferably less than 2.2.

From another aspect the invention consists in a method of forming a low k dielectric layer including:
  a) depositing an unset dielectric layer on a substrate, the dielectric layers including Silicon, Carbon and Oxygen.
  b) forming or depositing a semi-permeable skin on or of the surface of the layer; and
  c) setting the layer whereby at least part of the layer is porous.

The unset layer may be deposited by chemical vapour deposition, as a liquid or by any other suitable deposition means.

The semi-permeable skin may be formed by exposure of the unset dielectric layer to an activated gas, which may be, predominantly, a constituent of the deposition gas mix, when chemical vapour deposition occurs. For example it may be the carrier gas of the deposition gas mix, in which case the carrier gas may be continued after the deposition process is terminated by the termination of the process gas flow. A period or periods of gas flow with no plasma or activation may also be desirable. Alternatively it may be a process gas which is maintained after another process gas is reduced in flow or switched off. In one approach the process gas or gases may be pulsed, whilst the carrier gas or other process gas is maintained, in which case a series of semi-permeable skins may be built up in a strata-like formation throughout the deposited layer so as to control more fully out gassing and hence increase porosity. The activated gas may be activated by electrical discharge or a plasma or other suitable mechanisms.

In the alternative, a semi-permeable skin may be deposited upon the surface of the unset dielectric layer. For example, it may be deposited by chemical vapour deposition or plasma enhanced chemical vapour deposition or it may be deposited in liquid form, e.g. using spin on techniques. Alternatively the semi-permeable skin may be formed by at least partially curing a surface zone of the layer. In any event the layer is preferably set at least predominantly after the formation of the semi-permeable skin so that the out gassed materials can shape the internal structure of the material. This setting may include heating to remove substantially all O—H and the step of setting the layer may include exposing the layer to an activated gas, which may be predominantly hydrogen. The hydrogen can be activated in a plasma, by electrical discharge or other suitable mechanisms.

It is preferred that the porosity of the layer consists predominantly of closed cell voids and that the layer is hydrophobic. The dielectric layer may include Si—$CH_x$ where x is an integer from 1 to 3.

From another aspect the invention consists in a method of forming a low k dielectric layer including:
  (a) depositing an unset dielectric layer on a substrate, the dielectric layer including Silicon, Carbon and Oxygen;
  (b) exposing the surface of the dielectric layer to activated Nitrogen; and
  (c) exposing the layer to activated Hydrogen.

The dielectric layer may be deposited by chemical vapour deposition, in which case the chemical vapour deposition process gases may be carried by Nitrogen. These process gases may be pulsed or periodically switched off to enable a series of Nitrogen processes on the unset layer as it is progressively deposited. It is proposed that this would create semi-permeable strata spaced depthwise through the layer. The flow rates of the process gases may be adjusted to deposit a layer of varying chemical composition. For example by incorporating more carbon in the upper portions of the layer, the k of the whole layer may be reduced as the carbon is removed subsequently by the activated hydrogen.

In any of the methods described above the steps (a) and (b) may be performed in a single chamber and step (b) may be performed immediately after step (a). It has been determined that the formation of the semi-permeable skin or partially cured zone prior to any further setting of the material, by whatever mechanism, significantly further reduces the depth-wise shrinkage of the layer, though the formation of the skin may be coincidental with at least part of the curing or setting of the layer.

An idealised complete process would take place in a single chamber whereby deposition, surface treatment and then curing/setting would take place with instantaneous changes of process conditions. In all cases where the process is a plasma enhanced chemical vapour deposition process then a practical process of the invention is most efficiently performed in the following manner. Deposition takes place in one chamber that is relatively cold whilst the curing or setting process that requires heat is performed in another chamber linked by a vacuum transfer vessel. Deposition is terminated by one or more, but not all gasses being stopped, the plasma or activated gas exposure and/or skin formation thereby resulting. This minimizes outgassing from the as-deposited film that occurs during wafer transfer and wait states within the equipment such as gas flow or pressure stabilization times. In a preferred embodiment a process gas or gasses that does not deposit film is continued and nitrogen is particularly preferred. It may be used as a so-called 'ballast', 'dilutant' or 'carrier' gas with the chemically active deposition gasses. The active deposition gas or gas mix is then terminated to allow the plasma exposure/skin formation step. The aim is as far as possible not to allow volatile components to leave the film during a transfer or other wait state after the deposition step. It should be understood that where there are more than one deposition gasses then deposition may be halted by halting less than all the deposition gases.

From a further aspect the invention consists in a method as defined above wherein steps (a) and (b) are performed in a single chamber.

It is preferred that in any embodiment in which semi permeable strata are formed that they are no more than 500 Å thick.

Although the invention has been defined above, it is to be understood that it includes any inventive combination of the features set out above or in the following description.

BRIEF DESCRIPTION OF THE DRAWINGS

The invention may be performed in a number of ways and specific embodiments will now be described by way of example, with reference to the accompanying drawings in which.

DETAILED DESCRIPTION OF THE PREFERRED EMBODIMENTS

It has been known for some time that low dielectric constant films could be formed by reacting silicon-containing organic compounds with oxygen containing compounds to form a film of material containing Silicon Carbon and Oxygen and spin on versions of such materials have also been manufactured. It has also been understood that the provision of a porous film can lead to a low dielectric constant, even if the material forming the film is not, of itself, a particularly low dielectric constant material. However, no satisfactory process for forming porous chemical vapour deposition films has been previously proposed and the mechanisms for forming porous spin on films tend to lead to an open style structure, which is susceptible to the absorption of water (with a k value of 70). It will be understood that such absorption immediately removes the dielectric constant advantages of porosity. A further problem is that materials which have been rendered porous tend to shrink depthwise as they set making it difficult to form a layer which has a sufficiently low dielectric constant, due to the reduced thickness of the film and densification.

The applicants have, however discovered, that if they deposit an unset dielectric layer on a substrate and that dielectric layer contains Silicon, Carbon and Oxygen, then the gas created by the outgassing of O—H, water and/or volatile organic components within the film can be utilised to create a porous structure within the film. This utilisation is achieved by treating the exposed surface of the film so as to form a semi-permeable skin on the surface of the layer and/or to partially cure the surface layer. It has been determined that if the outgassing is restricted and/or controlled in this manner then, when the layer is cured, the material sets with a porous or more porous structure created by the outgassing.

Figure 1:
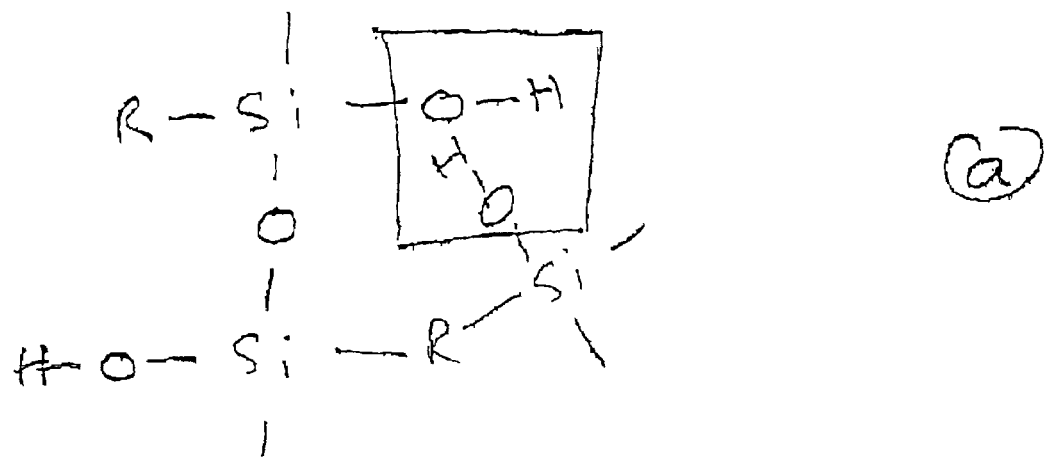
FIG. 1A is a schematic illustration of the composition of an as deposited film.
FIG. 1B illustrates a part of a possible setting mechanism.
Figure 1:
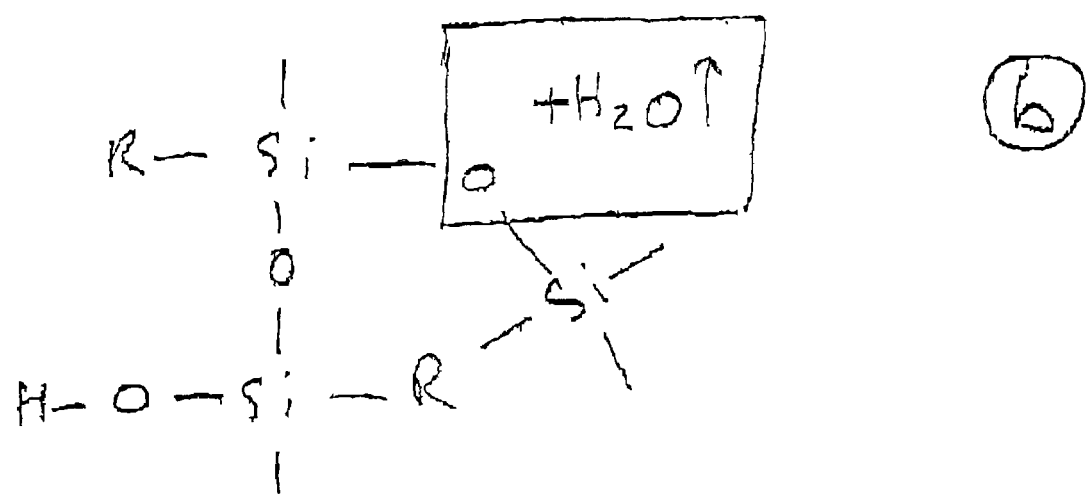

By way of example reference is made to FIG. 1. The as deposited film, as illustrated in FIG. 1a, is an organic containing loose silanol type structure in which there are a substantial number of hydrogen atoms. In the setting or curing process adjoining O—H molecules are brought together resulting in cross-linking and water is thus evolved. Typically organic volatile components are also evolved. By limiting the rate at which these vapour by-products are generated voids can be created in the unset layer. These voids can be retained and evacuated of O—H and water by further processing to ensure that predominantly all evolved gases are driven from the layer and the layer is fully set.

Experimentally this setting has been achieved by heat and the application of a hydrogen-containing plasma. The hydrogen chemically modifies the matrix of the porous film thereby lowering the dielectric constant further.

Figure 2:
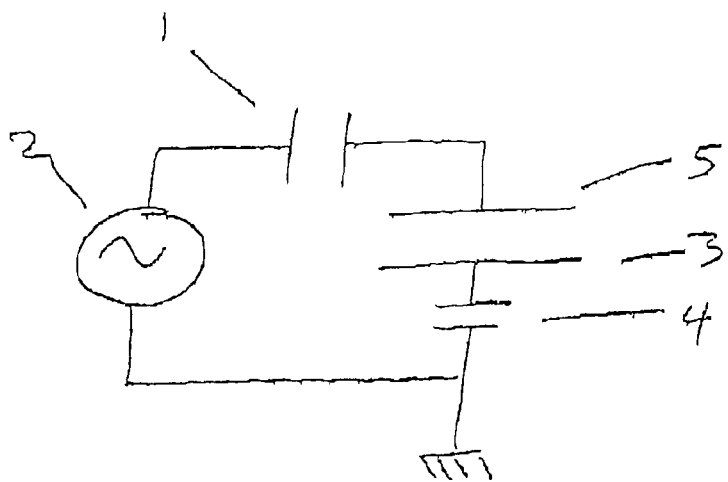
FIG. 2 is an electrical equivalent circuit of a typical plasma reactor suitable for deposition.
Figure 3:
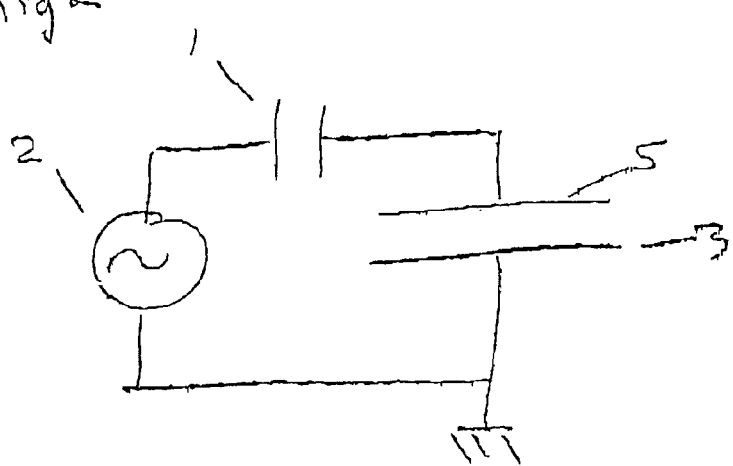
FIG. 3 is the corresponding circuit when the wafer support surface is a conductor.
Figure 4:
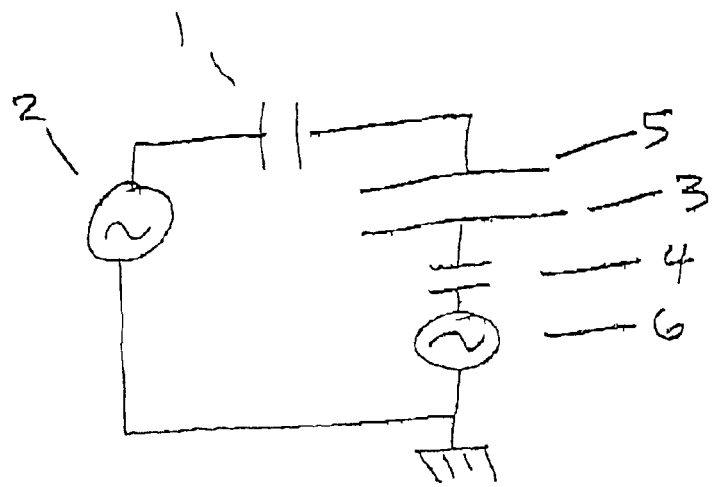
FIG. 4 illustrating the application of RF into the FIG. 3 circuit.

Whilst a plasma enhanced deposition process does not require significant ion bombardment of the wafer surface, formation of the semi-permeable skin preferably does. Thus ideally the deposition takes place with the substrate placed upon an insulator or electrically floating the wafer support from ground potential such that the wafer does not take a D.C. potential. The semi permeable skin formation is however better achieved by a greater degree of ion bombardment than achieved in such a reactor vessel. This may be most effectively achieved by placing the substrate upon a grounded support surface. In FIG. 2 is shown the electrical equivalent circuit of a typical plasma reactor vessel suitable for deposition. It can be seen that it is RF symmetric and as a result no material D.C. potential appears. A D.C. blocking capacitor 1 is at the output of an R.F. generator 2 before the powered electrode 5 and the wafer support 3 is a D.C. blocking capacitor 4. If however the wafer support cover is conductive rather than an insulator then the equivalent circuit is as FIG. 3. It can thus be seen that it is possible to switch between these two circuits by the switching of a capacitor where the wafer support is conductive. In the case where the support top is covered in an insulator or is stood off from ground by a capacitor, then an R.F voltage may be applied to the wafer support. This is shown in FIG. 4 with a separate R.F. generator 6, although this may be the same generator as 2 or may consist of a matching unit or whatever is well known in the art to achieve a D.C. voltage potential at the substrate surface. Matching units are frequently associated with R.F. generators but are not shown for clarity.

It will be understood that the setting or curing of the layer can be performed by many different mechanisms including light or the use of an alternative activated gas or combinations of those processes with or without heating whilst the surface treatment to control outgassing preferably should take place before any of those steps.

It is also believed that where the layer is put down as a continuous process, e.g. chemical vapour deposition, or where it is put down in more than one step, it may be beneficial to form localised semi-permeable or partially cured surface layers so as to build up a strata-like formation and thus more precisely control the outgassing of evolved gaseous by-products of the setting process.

In chemical vapour deposition this could be achieved by pulsing the deposition process gases relative to the surface treatment process and indeed pulsing of the process gases may be advantageous, different deposition gas pulse times being used to achieve a graduated chemistry throughout the layer so that the bulk of the layer can have enhanced porosity, but the upper portion of the layer can have good mechanical and/or hydrophobic properties.

Experiment

A nominal 5,000 Å thickness of a methyl containing silicon dioxide type material was deposited from tetramethyl silane and oxygen in a nitrogen carrier or ballast. Wafer temperature was set at 30° C. and process conditions were kept the same except for the introduction of and increasing time for a nitrogen 'skin' forming plasma immediately after the deposition process. The wafers were then transferred under vacuum to a heated wafer support and treated with a hydrogen plasma for 5 minutes. In all cases after the heating and plasma treatment process approximately 300 Å of the upper surface was removed by an etch process in situ. The nitrogen 'skin' forming plasma was run in the deposition chamber immediately after deposition, by turning off the tetramethyl silane and oxygen and allowing the nitrogen to continue to flow.

| | Nitrogen plasma | | | | |
|---|---|---|---|---|---|
| | Wafer 1. | | None | | |
| | Wafer 2. | | 5 seconds | | |
| | Wafer 3. | | 10 seconds | | |
| | Wafer 4. | | 30 seconds | | |
| Wafer | Top Layer Thickness | Top Layer R.I | Bottom Layer Thickness | Bottom Layer RI | Total Thickness |
| 1 | 1245 | 1,4307 | 3815 | 1.3059 | 5060 |
| 2 | 1740 | 1,3832 | 4400 | 1.2546 | 6140 |
| 3 | 2230 | 1,4115 | 6855 | 1.2667 | 9085 |
| 4 | 1533 | 1,3504 | 7792 | 1.2855 | 9325 |

For the purposes of accuracy with a Therma Wave Optiprobe, it has been found useful to consider these films as (only) bilayered, though it should be stressed that this is a pragmatic approximation to achieve consistent and accurate measurements.

For wafer 1 the hydrogen plasma process may be considered to be forming a semi permeable skin, though it is sub optimal not least because it comes after a vacuum transfer and approximately 10 seconds of wait time on a heated chuck before the plasma commences. This allows gaseous by-products to evolve from the wafer before skin formation.

For wafers 2 to 4 a semi permeable skin was formed by the nitrogen plasma prior to any wafer transportation or wait states thus maximizing the potential for gas source porosity within the film. Increasing nitrogen plasma times lead to thicker and thus less permeable skin formation.

As can be seen longer nitrogen process times yielded thicker films of lower refractive index R.I. As the deposition and curing process steps were identical this suggests greater porosity. Reliable dielectric constant measurements have only yet been carried out on wafers 1 and 2 at this time yielding a reduction in dielectric constant from 2.341 for wafer 1 to 2.319 for wafer 2.

Visual appearance of wafers 3 and 4 are of a wrinkly surface reminiscent of a soufflé.

At this time the surface effects of the nitrogen plasma are not fully known other than it is an effective surface treatment to achieve porosity. What is also evident is that this nitrogen plasma process is not forming a significant silicon nitride layer as such a layer is well known to be highly impervious and would therefore not allow the passage of the gaseous by-products.

It can be understood that the process conditions for the semi permeable skin formation may be determined by experimentation and will depend on, amongst other things, the thickness of the as deposited untreated layer. Plasma exposure of the film tends to create an undesirable damaged surface with carbon depletion and a higher k value and this and the reduction in process time will generally favour shorter process times and lower plasma power levels. The skin forming processes disclosed here are merely examples sufficient for the purposes of this disclosure.

An activated gas may include more than one gaseous constituent.

Process optimisation of the semi permeable skin has continued in particular on thin films without any etch back of the carbon depleted 'crust' layer, which is frequently formed at the upper surface. The crust may usefully be left in place e.g. to allow its use as a protective hard layer during chemical mechanical polishing (CMP) as part of the damascene process flow that is in widespread use for copper metalisation schemes. Thin films present a processing dilemma for the production of porous low-k films as part of the process methodology presented here. If the same deposition conditions are used for both thick and thin films (different process time only) and cure times similarly changed only in duration then thinner films, even with their (higher k value) crust etched back, have higher k values than thicker films. We can therefore deduce that they are denser films and it is a requirement to obtain lower k values for thinner films. A modified cure process is therefore required, particularly for thinner films.

Further experiments were therefore carried out to determine the best methodology for production of a semi-permeable membrane to allow volatile components to outgas, whilst retaining them well enough to create the porous structure desired. If the skin is not permeable enough then the outgassing is destructive and bubbling, blistering or peeling may take place. If the skin is too permeable then k values are not at their lowest.

There is therefore a requirement for a cure process that minimises k values particularly for thinner films (e.g. less than 6,000 Angs thicknesses). It has been discovered that a multipart process is better than a single step. The experimental apparatus has a large thermal mass wafer chuck and therefore chuck temperature could not be quickly changed and this may be typical of a suitable process chamber as by-products are deposited onto the chamber walls (requiring plasma etch back). Alternative heating arrangements such as lamp based wafer backside heating may allow rapid wafer temperature ramping and it is a useful process condition to vary between cure steps if possible.

Experiments on cures were performed as follows: Process time is in seconds, power is 13.56 Mhz applied to an upper showerhead, at 100° C., forming the electrode 5. Wafer platen temperature was 400° C. Hydrogen gas was used at a pressure of 4 torr.

| Process | Refractive Index | Predicted K-value | Peeling |
|---|---|---|---|
| 140 s/2700 W | 1.314 | 2.327 | Yes |
| 70 s/2700 W | 1.331 | 2.404 | Slight |
| 140 s/1000 W | 1.326 | 2.381 | No |
| 140 s/1500 W | 1.301 | 2.268 | Yes |
| 35 s/100 W, 35 s/1500 W, 70 s/2700 W | 1.311 | 2.313 | No |
| 35 s/100 W, 105 s/1500 W | 1.314 | 2.327 | No |
| 35 s/1000 W, 105 s/2700 W | 1.316 | 2.336 | No |

The final three runs showed no peeling with significantly lower k values (predicted by the refractive index). Hardness was measured on the thin films and showed an increase with increasing power though the actual values have not been quoted, as the 'substrate effect' has impacted the results for such thin films. Slightly lower powers were decided on and further optimisation was carried out to define the process window for films of a nominal 3,000 Å thickness:

| Process | Refractive Index | Predicted k-value | Peeling |
|---|---|---|---|
| 35 s/1000 W, 105 s/2000 W | 1.317 | 2.340 | No |
| 35 s/1000 W, 140 s/2000 W | 1.306 | 2.291 | Yes |
| 35 s/1000 W, 120 s/2000 W | 1.308 | 2.300 | No |
| 35 s/1000 W, 85 s/1500 W | 1.320 | 2.354 | No |
| 70 s/1000 W, 70 s/2000 W | 1.3214 | 2.36 | No |
| 100 s/1000 W, 70 s/2000 W | 1.294 | 2.237 | No |
| 100 s/1000 W, 105 s/2000 W | 1.274 | 2.147 | Spotty |
| 100 s/1000 W, 140 s/2000 W | 1.287 | 2.205 | Yes |
| 150 s/1000 W, 70 s/2000 W | 1.3104 | 2.311 | No |
| 110 s/1000 W, 70 s/1500 W | 1.3298 | 2.398 | No |
| 190 s/1000 W, 70 s/2000 W | 1.2878 | 2.209 | Yes |
| 150 s/1000 W, 35 s/2000 W | 1.3168 | 2.340 | No |
| 150 s/1000 W, 140 s/2000 W | 1.2865 | 2.203 | Yes |

Note that the different cure processes yielded films of varying thickness where the lower the refractive index the thicker the film—indicating increased porosity.

These experimental results point to the value of a multi-step cure process of at least two steps with at least one variable altered between any two of those steps. Process variables may include; time, temperature, plasma power applied, pulsing of the power, pulse mark/space ratio, gas composition and pressure. The power may be switched between the wafer chuck, (electrode 3) and an opposing showerhead and/or the electrical status of the wafer may be changed from floating (wafer at plasma potential) to grounded or driven (whereby there is significant energetic bombardment of the wafer).

At its simplest a cure 'step' may include consideration of the process conditions immediately prior to plasma treatment. In a preferred deposition system the wafer is cured in a chamber separated from the deposition chamber. The wafer chuck will generally be at temperature and therefore the time the wafer spends in this chamber prior to plasma ignition plays an important part in the curing. Experimentally it has been found that placing the wafer onto the hot chuck and commencing the plasma treatment after a short 'gas stabilisation' time yields thicker, lower density films equating to lower k values. In one series of experiments reducing the time the wafer spent on the 400° C. chuck prior to hydrogen plasma treatment from 10 seconds to 1 second lowered the k value from 2.37 to 1.97. Interestingly, holding the wafer on the wafer transport lift pins above the chuck, igniting the plasma, and then lowering the wafer to the chuck experimentally caused severe blistering and peeling of the films in the particular experimental apparatus, though this may present a suitable process variable in alternative chambers, e.g. where the upper electrode is spaced further apart than the 25 mm used here. This experimental result demonstrated that a skin of low permeability had been rapidly formed and/or insufficient volatile outgassing had occurred prior to skin formation.

The following process conditions represent the best known process at this time and yield a fully set film of 3,000 Angst thickness with a k value of 2.2 for the whole film thickness, including carbon deleted crust layer. This is an extremely low k value and lower than any other CVD deposited silicon oxide reported at this time suitable for damascene processing of interconnects for thin film devices. Deposition took place in one chamber of a cluster tool, with the cure taking place in a separate dedicated chamber, with vacuum transport at ambient temperatures between chambers.

| Parameter | Deposition | Cure (step 1) | Cure (step 2) |
|---|---|---|---|
| Platen Temp (C.) | 35 | 400 | 400 |
| Showerhead Temp (C.) | 100 | 100 | 100 |
| Electrode Gap (mm) | 20 | 25 | 25 |
| Pressure torr | 2 | 4 | 4 |
| Power (W) 13.65 Mhz to showerhead | 300 | 1000 | 2500 |
| 4MS flow (Sccm) | 700 | 0 | 0 |
| O2 Flow (Sccm) | 400 | 0 | 0 |
| N2 Flow (Sccm) | 2400 | 0 | 0 |
| H2 Flow (Sccm) 1 second gas stabilization prior to plasma ignition | 0 | 1600 | 1600 |
| Time, seconds | 42 | 90 | 90 |

Whilst the specific optimum process conditions will vary with the chemical composition of the film its thickness and other parameters, these can be determined by empirical experiment using the following insights of the Applicants. Films that are cured in a single high power step tend to form a semi permeable surface layer more quickly than at lower powers thereby slowing outgassing and creating a thicker, lower k value film. However this upper layer or crust will be of a higher k value than the lower layer and will be thicker at high powers than at low powers. To reduce k values still further in this single step cure regime, particularly for thinner films therefore means that the lower, porous layer has to be very porous (to compensate for the higher k value of the upper layer). Porosity means less solid material and in effect there can be insufficient material at the lower interface to enable good adhesion to the underlayer. As a result high power single step processes on thin films may cause peeling, delamination, blistering etc. and there is insufficient total film depth to allow a sufficient thickness of low k porous underlayer. This problem may be overcome by a multistep cure process where the required k value is to be reduced still further and/or it is desired to not at least partially remove the upper layer. An initial lower power creates a sufficient surface layer to cause a slowed but sufficient evolution of gaseous material to allow the desired porosity of the underlayer, followed by a higher power to complete the curing process where the total time/power is sufficiently low as to minimize the damage to the surface layer thereby minimizing its k value.

Porosity can therefore be enhanced by having an initial period of low power cure, which can enhance outgassing, followed by a high power cure to promote the crust formation, the power, however, being selected so that the porosity near the interface with the substrate does not reach a point at which mechanical instability sets in promoting pealing of the film. On the other hand a cure which is not sufficiently aggressive in the initial period may lead to insufficient outgassing of unreacted precursors giving rise to bubbling in the film during subsequent anneal or processing. For this reason over extended and/or overpowered final cures may leave a crust which is not sufficiently porous to allow an amount of post cure outgassing or, additionally or alternatively, it may lead to excess porosity at the interface.

What is claimed is:

1. A method of forming a low k dielectric layer including:
  (a) depositing an unset dielectric layer on a substrate, the dielectric layer including Silicon, Carbon and Oxygen;
  (b) exposing the surface of the dielectric layer to an activated gas to form a semi-permeable skin on or of the surface of the layer; and
  (c) curing the layer to render at least part of the layer porous.

2. A method as claimed in claim 1 wherein the dielectric layer is deposited by chemical vapour deposition.

3. A method as claimed in claim 1 further including removing at least part of the semi-permeable skin prior to the layers functional use.

4. A method as claimed in claim 3 wherein the dielectric constant of the layer is less than 2.4.

5. A method of forming a low k dielectric layer including:
  (a) depositing an unset dielectric layer on a substrate, the dielectric layer including Silicon, Carbon and Oxygen;
  (b) at least partially curing a surface zone of the layer; and
  (c) curing the layer to render the bulk of the layer porous.

6. A method as claimed in claim 5 wherein the dielectric layer is deposited by chemical vapour deposition.

7. A method as claimed in claim 5 further including removing at least part of the surface zone prior to the layers functional use.

8. A method as claimed in claim 7 wherein the dielectric constant of the layer is less than 2.4.

9. A method of forming a low k dielectric layer including:
  a) depositing an unset dielectric layer on a substrate by chemical vapour deposition, the dielectric layer including Silicon, Carbon and Oxygen;
  b) forming or depositing a semi-permeable skin on or of the surface of the layer; and
  c) setting the layer whereby at least part of the layer is porous.

10. A method as claimed in claim 9 where the unset dielectric layer is deposited by plasma enhanced chemical vapour deposition.

11. A method as claimed in claim 10 where the semi-permeable skin is formed by exposure of the unset dielectric layer to an activated gas.

12. A method as claimed in claim 11 wherein the activated gas is predominately a constituent of the deposition gas mix.

13. A method as claimed in claim 11 where the activated gas is a gas of the deposition gas mix.

14. A method as claimed in 13 where the gas is continued after the deposition process is terminated by termination of the process gas flow.

15. A method as claimed in claim 14 wherein the process gases are pulsed whilst the gas is maintained.

16. A method as claimed in claim 11 where the gas is activated by electrical discharge or plasma.

17. A method as claimed by claim 9 where the unset dielectric layer is deposited as a liquid.

18. A method as claimed in claim 9 where the semi-permeable skin is deposited upon the surface of the unset dielectric layer.

19. A method as claimed in claim 9 where the semi-permeable skin is chemically vapour deposited.

20. A method as claimed in claim 19 where the semi-permeable skin is plasma enhanced chemical vapour deposited.

21. A method as claimed in claim 9 where the semi-permeable skin is liquid deposited.

22. A method as claimed in claim 9 where the semi-permeable skin is formed by at least partially curing a surface zone of the layer.

23. A method as claimed in claim 9 where the layer setting is at least predominately after the formation of the semi-permeable skin.

24. A method as claimed in claim 9 wherein the film is cured by an initial treatment period and a subsequent treatment period, the initial treatment period being such as to promote a lower cure rate than the subsequent period.

25. A method as claimed in claim 24 wherein the subsequent period is itself split into periods of increasing cure rates.

26. A method as claimed in claim 9 wherein the cure is achieved by the application of power and the power is lower during the initial period.

27. A method as claimed in claim 26 wherein the initial period is between 35 and 110 secs and the subsequent period is between 70 and 110 secs and wherein the power in the initial period is about 1100W and the power in the second period is between about 1500W and about 2000W.

28. A method as claimed in claim 9 where the setting of the layer includes heating to remove substantially all O—H.

29. A method as claimed in claim 9 where the step of setting the layer includes exposing the layer to an activated gas.

30. A method as claimed in claim 29 where the activated gas is predominately hydrogen.

31. A method as claimed in claim 29 where the activation is by electrical discharge.

32. A method as claimed in claim 9 wherein the porosity of the layer consists predominately of closed cell voids.

33. A method as claimed in claim 9 where the layer is hydrophobic.

34. A method as claimed in claim 9 where the dielectric layer includes $Si\text{-}CH_x$ where x is an integer from 1 to 3.

35. A method of forming a low k dielectric layer including:
  a) depositing an unset dielectric layer on a substrate, the dielectric layer including Silicon, Carbon and Oxygen;
  b) exposing the surface of the dielectric layer to activated Nitrogen; and
  c) exposing the layer to activated Hydrogen.

36. A method as claimed in claim 35 wherein the dielectric layer is deposited by chemical vapour deposition.

37. A method as claimed in claim 36 wherein the chemical vapour deposition gas mix includes Nitrogen.

38. A method as claimed in claim 36 wherein the deposition process gases are periodically switched off to enable a series of Nitrogen processes on the unset layer as it is progressively deposited.

39. A method as claimed in claim 35 wherein the flow rates of the process gases are adjusted to deposit a layer of a varying chemical composition.

40. A method as claimed in claim 35 wherein steps (a) and (b) are performed in a single chamber.

41. A method as claimed in claim 35 wherein step (b) is performed immediately after step (a).

42. A method as claimed in claim 35 wherein step (a) is performed on a substrate with no material D.C. bias and step (b) is performed on a substrate with a material D.C. bias.

43. A method as claimed in claim 42 wherein the substrate is located on a substrate support and the D.C. bias is applied by means of R.F. voltage to the substrate support.

* * * * *